United States Patent
Cok

(10) Patent No.: US 7,049,745 B2
(45) Date of Patent: May 23, 2006

(54) OLED DISPLAY HAVING THERMALLY CONDUCTIVE LAYER

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 191 days.

(21) Appl. No.: 10/722,243

(22) Filed: Nov. 25, 2003

(65) Prior Publication Data

US 2005/0110396 A1 May 26, 2005

(51) Int. Cl.
*H01J 1/62* (2006.01)

(52) U.S. Cl. .................. 313/512; 313/504; 313/45; 313/46

(58) Field of Classification Search ........ 313/498–512, 313/113, 114, 44–46, 13; 428/917; 315/169.3
See application file for complete search history.

(56) References Cited

U.S. PATENT DOCUMENTS

| | | | | |
|---|---|---|---|---|
| 4,963,788 A | * | 10/1990 | King et al. ................ | 313/503 |
| 5,124,204 A | * | 6/1992 | Yamashita et al. .......... | 428/331 |
| 5,491,378 A | * | 2/1996 | Lee et al. .................. | 313/506 |
| 5,841,230 A | * | 11/1998 | Ikoma et al. ............... | 313/506 |
| 6,198,217 B1 | * | 3/2001 | Suzuki et al. .............. | 313/504 |
| 6,265,820 B1 | | 7/2001 | Ghosh et al. | |
| 6,366,017 B1 | * | 4/2002 | Antoniadis et al. ......... | 313/506 |
| 6,480,389 B1 | | 11/2002 | Shie et al. | |
| 6,641,933 B1 | | 11/2003 | Yamazaki et al. | |
| 6,744,199 B1 | * | 6/2004 | Tanaka ....................... | 313/512 |

FOREIGN PATENT DOCUMENTS

| | | |
|---|---|---|
| JP | 08-124679 | 5/1996 |
| JP | 10-275680 | 10/1998 |
| JP | 10-275681 | 10/1998 |

* cited by examiner

*Primary Examiner*—Ashok Patel
(74) *Attorney, Agent, or Firm*—Andrew J. Anderson

(57) ABSTRACT

An OLED display is described comprising: a) a substrate; b) one or more OLED light emitting elements including a first electrode formed on the substrate, one or more OLED light emissive layers located over the first electrode, and a second electrode located over the OLED light emissive layers; and c) an encapsulating cover located over the second electrode and affixed to the substrate; wherein the substrate or cover comprises a composite of a non-metallic layer and a metal layer, where the metal layer has a thickness between 1 micron and 1,000 microns and is thinner than the non-metallic layer. The invention enables OLED displays with improved lifetime, while minimizing need for increased substrate and/or cover layer thickness.

15 Claims, 3 Drawing Sheets

OLED DISPLAY HAVING THERMALLY CONDUCTIVE LAYER

FIELD OF THE INVENTION

The present invention relates to organic light-emitting display devices. In particular, the present invention relates to reducing localized aging due to heating within an organic light-emitting display device.

BACKGROUND OF THE INVENTION

Organic light-emitting diode (OLED) display devices typically include a substrate having one or more OLED light-emitting elements including a first electrode formed thereon, one or more OLED light-emitting layers located over the first electrode, and a second electrode located over the OLED light-emitting layers, and an encapsulating cover located over the second electrode and affixed to the substrate. Such devices may be top-emitting, where the light-emitting elements are intended to be viewed through the cover, and/or bottom-emitting, where the light-emitting elements are intended to be viewed through the substrate. Accordingly, in the case of a bottom-emitting OLED device, the substrate must be largely transparent, and in the case of a top-emitting OLED device, the cover must be largely transparent.

A variety of materials may be used to construct suitable substrates and encapsulating covers for OLED devices. The desirable material properties and/or characteristics of an OLED substrate include low cost, very flat, low coefficient of thermal expansion (CTE), high strength and stability under a variety of environmental stresses, and electrically non-conductive (or able to be coated with electrically non-conductive material on the substrate surface contacting the OLED). It is important that the material forming the substrate on which electrical circuitry is deposited is electrically non-conductive so that any electrical circuitry formed thereon is not shorted. The material used most often for such substrates is glass, typically borosilicate glass, because it is transparent, very stable, can be made at low-cost, and has a very smooth surface suitable for the deposition and processing of semiconductor and organic materials. Other substrate materials have been described in the art, for example ceramics, plastics, and metals such as stainless steel (see U.S. Pat. No. 6,641,933 B1 to Yamazaki et al entitled "Light-emitting EL display device"). However, metals are conductive and so their use typically requires additional electrically non-conductive insulating layers. Metal supports typically also have a relatively high CTE, which may cause stresses in any devices deposited on the substrate. Metal and glass materials are also used in OLED encapsulating covers, for example in products demonstrated and sold by the Eastman Kodak Company.

Organic light-emitting diodes can generate efficient, high-brightness displays. However, heat generated during the operation of the display in high-brightness modes can limit the lifetime of the display, since the light-emitting materials within an OLED display degrade more rapidly when used at higher temperatures. While it is important to maintain the overall brightness of an OLED display, it is even more important to avoid localized degradation within a display. The human visual system is acutely sensitive to differences in brightness in a display. Hence, differences in uniformity are readily noticed by a user. Such localized differences in uniformity in an OLED display may occur as a consequence of displaying static patterns on the display, for example, graphic user interfaces often display bright icons in a static location. Such local patterns will not only cause local aging in an OLED display, but will also create local hot spots in the display, further degrading the light-emitting elements in the local pattern. Glass and plastic supports, the use of which is advantageous in view of their relative electrical non-conductivity, may not be sufficiently thermally conductive to provide a uniform temperature across the substrate when the display is in operation. Hence, improved thermal management techniques may significantly improve the life expectancy of an organic display device.

One method of removing heat from an organic light emitting display device is described in U.S. Pat. No. 6,265,820, entitled, "Heat removal system for use in organic light emitting diode displays having high brightness." The '820 patent describes a heat removal system for use in organic light emitting diode displays. The heat removal assembly includes a heat dissipating assembly for dissipating heat from the organic light emitting device, a heat transfer assembly for transferring heat from the top organic light emitting device to the heat dissipating assembly and a cooling assembly for cooling the organic light emitting display device. While the system of the '820 patent provides a means for heat removal in an OLED application, its efficiency is limited by the presence of a glass substrate having poor thermal conductivity characteristics through which heat generated by the OLED devices must transfer for removal. Moreover, the structure described in the '820 patent is complex, requiring multiple layers and specific, heat transfer materials in contact with delicate OLED layers.

U.S. Pat. No. 6,480,389 to Shie et al entitled "Heat dissipation structure for solid-state light emitting device package" describes a heat dissipation structure for cooling inorganic LEDs and characterized by having a heat dissipating fluidic coolant filled in a hermetically sealed housing where at least one LED chip mounted on a metallic substrate within a metallic wall erected from the metallic substrate. Such an arrangement is complex, requires fluids, and is not suitable for area emitters such as OLEDs.

Heat sinks are also well known in the integrated circuit industry and are applied to cooling large integrated circuits. Such sinks typically are thick and are unsuitable for displays in which limiting the thickness of the display is an important goal.

It is therefore an object of the invention to provide a more uniform distribution of heat within an OLED display and to optimize the removal of heat from an OLED display device to improve the lifetime of the display.

SUMMARY OF THE INVENTION

In accordance with one embodiment of the invention, an OLED display is described comprising: a) a substrate; b) one or more OLED light emitting elements including a first electrode formed on the substrate, one or more OLED light emissive layers located over the first electrode, and a second electrode located over the OLED light emissive layers; and c) an encapsulating cover located over the second electrode and affixed to the substrate; wherein the substrate or cover comprises a composite of a non-metallic layer and a metal layer, where the metal layer has a thickness between 1 micron and 1,000 microns and is thinner than the non-metallic layer. The invention enables OLED displays with improved lifetime, while minimizing need for increased substrate and/or cover layer thickness.

DETAILED DESCRIPTION OF THE INVENTION

Figure 1:
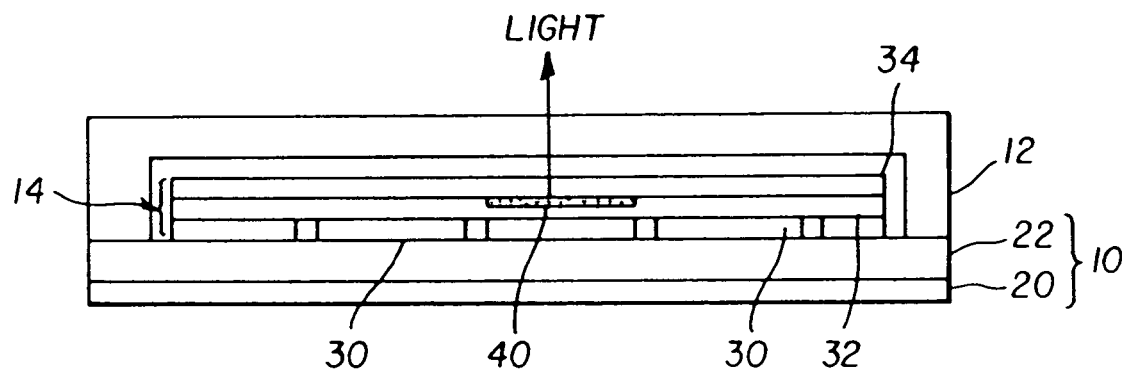
FIG. 1 is a schematic diagram of a top-emitting OLED display according to one embodiment of the present invention.

FIG. 1 illustrates a side view of a top-emitting OLED display in accordance with one embodiment of the present invention. The OLED display includes a composite substrate 10 having a non-metallic layer 22 on a first side and a metal layer 20 on a second side. The metal layer 20 has a thickness between 1 micron and 1,000 microns, preferably between 5 and 500 microns, and more preferably between 10 and 200 microns, and is thinner than the non-metallic layer 22 of the composite substrate 10. Suitable metals include, e.g., Al, Cu, Ag, Fe, Cr and Mg and alloys thereof. Preferred materials for the non-metallic substrate layer 22 include glass and plastics, with glass, and particularly borosilicate glass, being preferred for its electrical resistance, transparency, stability, low-cost, and smooth surface.

Formed upon the non-metallic layer 22 of the composite substrate 10 is one or more OLED light-emitting elements 14 including a first electrode 30 formed on the non-metallic layer 22, one or more OLED light-emitting layers 32 located over the first electrode 30, and a second electrode 34 located over the OLED light-emissive layers 32; and an encapsulating transparent cover 12 located over the second electrode 34 and affixed to the composite substrate 10. The OLED light-emitting element 14 may be formed using well-known basic OLED cell structures including stacks of thin organic layers sandwiched between the first and second electrodes 30 and 34. The organic layers typically comprise a hole-injection layer, a hole-transport layer, an emissive layer, and an electron-transport layer. When current is applied to any OLED light-emitting element 14, through the electrodes 30 and 34, the injected positive and negative charges recombine in the emissive layer to produce light (electroluminescence).

Light emitting OLED elements 14 may be separated by a plurality of non-emitting regions including circuitry utilizing thin film transistors (TFT) conductors, and other electrical components including, for example, capacitors. The OLED elements 14 may be controlled using passive-matrix or active-matrix techniques, as are known in the art.

Top-emitting OLED displays are encapsulated via the encapsulating cover 12 formed of a transparent material, such as glass, thereby allowing the emission light generated by OLED elements 14 to exit the device. Encapsulating cover 12 protects the top-emitting OLED display from moisture or contaminants in the environment. Space between the OLED elements and the encapsulating cover may be filled, e.g., with air, an inert gas, or a polymeric buffer layer. Bottom-emitting OLED displays are likewise encapsulated but, because the light is emitted through the substrate, the substrate must be transparent and the cover may be opaque.

In operation, the heat generated by the light emission of OLED elements (for example, at light emitting area 40 in FIG. 1) is conducted into the composite substrate 10. Furthermore, some heat is generated by the circuitry (not shown) within non-emitting regions but to a lesser degree compared with the heat generated by OLED elements. If the OLED light emitting elements 14 are differentially powered, localized hot spots will be formed within the display. These localized hot spots could contribute to differential degradation of the OLED materials in light emitting layer 32, reducing the lifetime of the display. The use of a composite substrate comprising a relatively thicker non-metallic layer and a relatively thin metal layer in accordance with the embodiment of FIG. 1 enables desired substrate properties associated with use of non-metallic materials such as glass, while also providing improved thermal management as further explained below.

Figure 2:
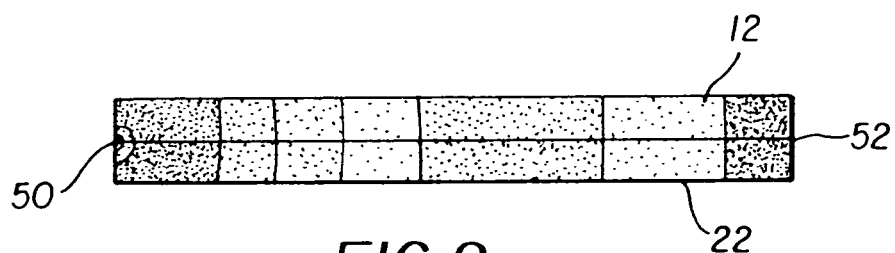
FIG. 2 is a diagram illustrating the heat flow of an OLED as known in the prior art.

Applicant has developed a variety of models for analyzing the heat flow within OLED displays and within various embodiments of the present invention. Referring to FIG. 2, a thermal model of a prior-art top-emitting OLED device is illustrated. The model is symmetric about the left edge and only one half of the structure is shown here and in the subsequent figures. In this structure, a glass substrate 22 (700 microns thick) is encapsulated by a glass cover 12 (also 700 microns thick). Energy is applied to a point 50 between the cover 12 and the substrate 22. The applied energy raises the temperature of the point 50 to 60° C. The similarly shaded areas in FIG. 2 represent areas with a band of the same approximate temperature. At the opposite end of the substrate 22 and cover 12, a temperature band 52 has a temperature of 29° C.

Figure 3:
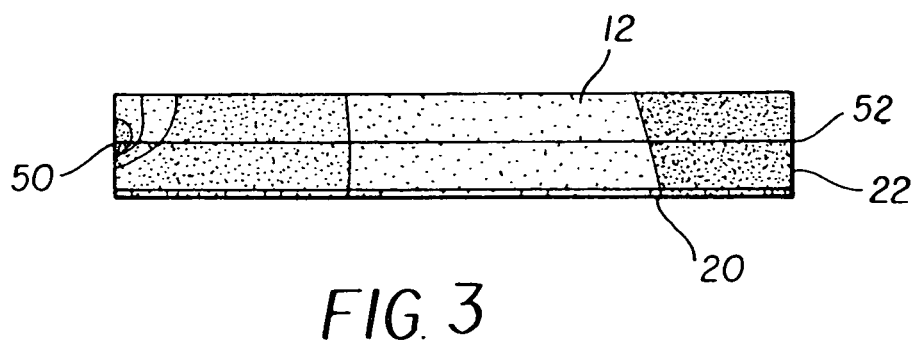
FIG. 3 is a diagram illustrating the heat flow of a top-emitting OLED display as shown in FIG. 1.

Referring to FIG. 3, a thermal model of a top-emitting OLED according to one embodiment of the present invention is illustrated. In this structure, a composite substrate with a glass layer 22 (700 microns thick) and a relatively thinner metal (Al) layer 20 (100 microns thick) is encapsulated by an encapsulating glass cover 12 (also 700 microns thick). The same amount of energy as was applied in the model of FIG. 2 is applied to a point 50 between the cover 12 and the glass layer 22 of the substrate. The applied energy raises the temperature of point 50 to only 38° C. As in FIG. 2, similarly shaded areas in FIG. 3 represent areas within a band of the same approximate temperature. At the opposite end of the substrate 22 and cover 12, temperature band 52 has a temperature of 27° C. As can be seen from a comparison of FIGS. 2 and 3, the use of a composite substrate having glass and metal layers according to one embodiment of the present invention has significantly lowered the temperature of the OLED device at point 50.

Figure 4:
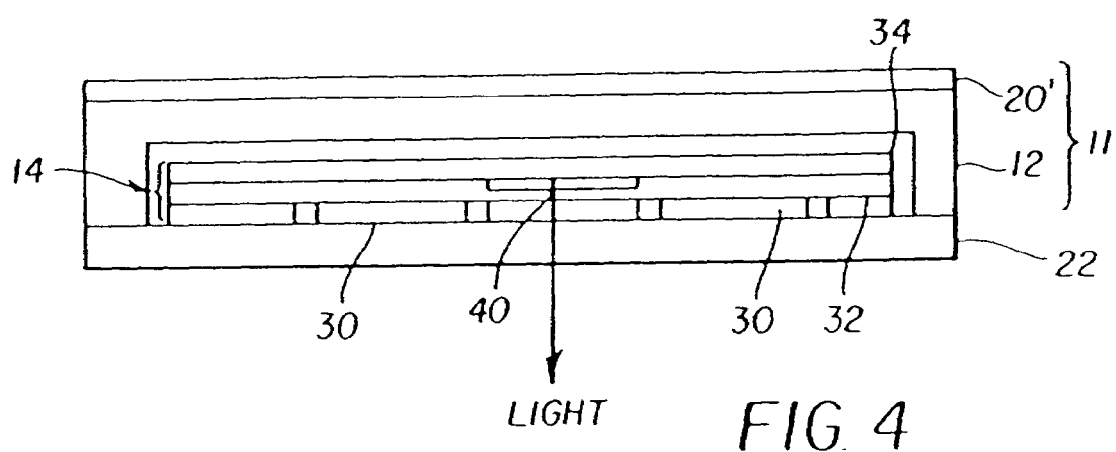
FIG. 4 is a schematic diagram of a bottom-emitting OLED display according to one embodiment of the present invention.
Figure 7:
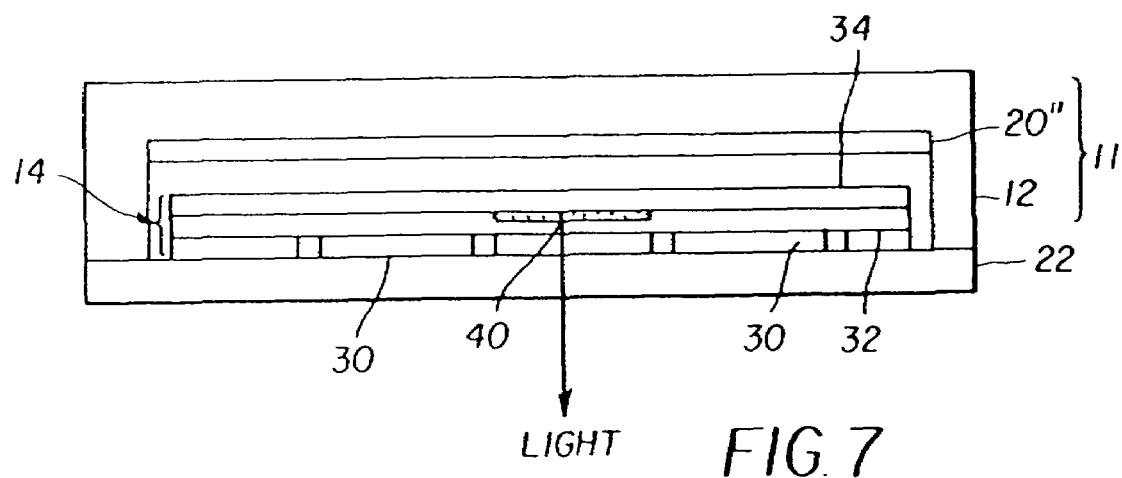
FIG. 7 is a schematic diagram of a bottom-emitting OLED display according to another embodiment of the present invention.

Referring to FIGS. 4 and 7, in alternative embodiments of the present invention, a bottom-emitting OLED display comprises a transparent substrate 22; one or more OLED light emitting elements including a first electrode 30 formed on the substrate 22, one or more OLED light emissive layers 32 located over the first electrode 30, and a second electrode 34 located over the OLED light emissive layers 32; and an encapsulating composite cover 11 having a non-metallic layer 12 on a first side and a metal layer 20' (FIG. 4) or 20" (FIG. 7) on a second side. Similarly as with metal layer 20 in the above described top-emitting embodiment, the metal layer 20' or 20" has a thickness between 1 micron and 1,000 microns, preferably between 5 and 500 microns, and more preferably between 10 and 200 microns, and is thinner than the non-metallic layer 12 of the composite cover 11. Similar materials as previously described for use in a composite substrate may also be used for the metal and non-metallic layers of composite cover 11.

The bottom emitting OLED device operates similarly to the top-emitting version with the difference that light passes through the substrate rather than through the cover. Accordingly, in the case of the bottom-emitting OLED display, the substrate 22 must be transparent while the composite cover 11 may be opaque. The cover non-metallic layer 12 may be located between the cover metal layer 20' and the second electrode 34 (i.e., the metal layer may be on the outside of the OLED display as shown in FIG. 4). Alternatively, the metal cover layer 20" may be located between the cover non-metallic layer 12 and the second electrode 34 (i.e., the metal layer may be on the inside of the OLED display as shown in FIG. 7).

Figure 5:
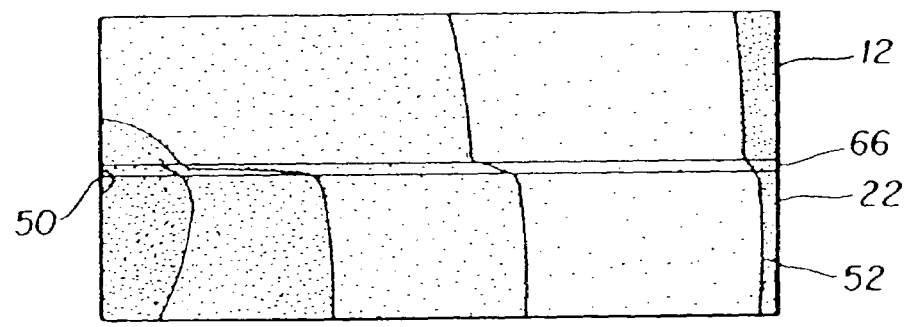
FIG. 5 is a diagram illustrating the heat flow of a bottom-emitting OLED as known in the prior art.

Referring to FIG. 5, a thermal model of a prior-art bottom-emitting OLED is illustrated. In this structure, a transparent glass substrate 22 (700 microns thick) is encapsulated by a glass cover 12 (also 700 microns thick). A 50-micron air gap 66 is provided to simulate the gap which may be present in OLED devices between the second electrode and the encapsulating cover 12 to accommodate the organic layers 32 and electrodes 30 and 34. Energy is applied to a single point 50 on the transparent substrate 22. The applied energy raises the temperature of the point to 60° C. Similarly shaded areas in FIG. 5 represent areas within a band of the same approximate temperature. At the opposite end of the substrate and cover, a temperature band 52 has a temperature of 37° C.

Figure 6:
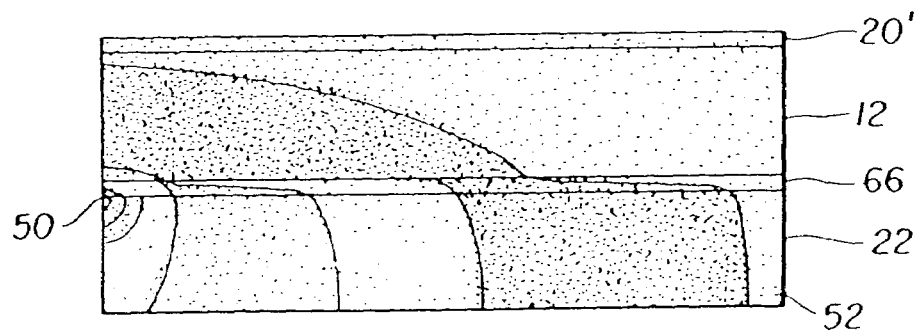
FIG. 6 is a diagram illustrating the heat flow of an OLED display as shown in FIG. 4.

Referring to FIG. 6, a thermal model of a bottom-emitting OLED according to one embodiment of the present invention is illustrated. In this structure, a transparent glass substrate 22 (700 microns thick) is encapsulated by a cover having a glass layer 12 (also 700 microns thick) and having a relatively thinner metal (Al) layer 20' (100 microns thick) on the outside of the OLED device. The substrate 22 and the glass layer 12 of the cover are separated by a 50-micron air gap 66 as in FIG. 5. The same amount of energy as was applied in the model of FIG. 5 is applied to a single point 50 on the substrate. The applied energy raises the temperature of the point to 45° C. As in FIG. 5, the similarly shaded areas represent areas within a band of the same approximate temperature. At the opposite end of the substrate 22 and cover 12, temperature band 52 has a temperature of 26° C. As can be seen from a comparison of the models of FIGS. 5 and 6, the use of a composite cover comprising a glass layer and a thinner metal layer according to one embodiment of the present invention has significantly lowered the temperature of the OLED device at point 50.

Figure 8:
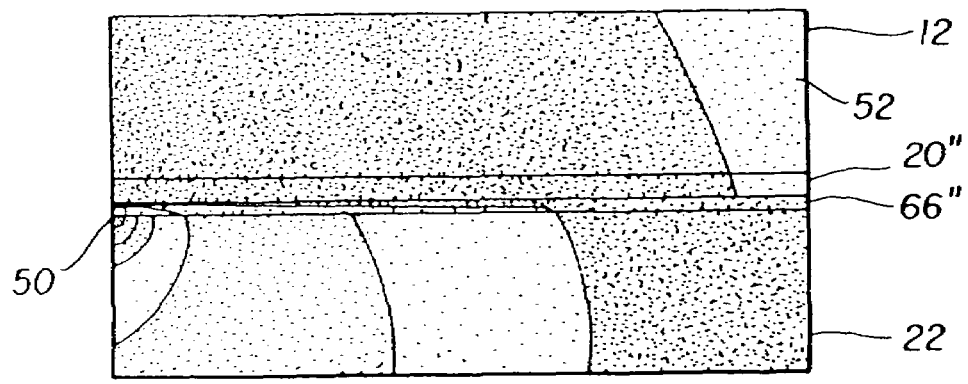
FIG. 8 is a diagram illustrating the heat flow of an OLED display as shown in FIG. 7.

Referring to FIG. 8, a thermal model of a bottom-emitting OLED according to another embodiment of the present invention is illustrated. In this structure, a glass substrate 22 (700 microns thick) is encapsulated by a cover having a glass layer 12 (also 700 microns thick) and having a relatively thinner metal (Al) layer 20" (100 microns thick) located on the inside of the OLED device next to the air gap 66. The same amount of energy as was applied in the model of FIG. 5 is applied to a single point 50 on the substrate. The applied energy raises the temperature of the point to 44° C. As in FIG. 5, similarly shaded areas represent areas within a band of the same approximate temperature. At the opposite end of the substrate and cover, a temperature band 52 has a temperature of 26° C. As can be seen from a comparison of FIGS. 5 and 8, the use of a composite cover has again significantly lowered the temperature of the OLED device at point 50.

In all three cases (FIGS. 3, 6, and 8), the use of a composite substrate or cover as described in the present invention significantly reduces the local heating of the substrate and cover, and the light-emitting materials deposited in close thermal contact with them. This reduction in heat has the beneficial effect of reducing the aging of the light emitting materials. Applicants have done experiments and modeling demonstrating the improvement in display lifetime due to the reduction in local heating. The modeling work is performed using conventional, commercially available modeling tools.

A variety of metals and thickness of layers may be used in the present invention, for example aluminum, copper, silver, iron, chromium, and magnesium and other thermally conductive metals. Alloys of these metals may also be suitable. Suitable metals or metal alloys are thermally conductive and readily deposited on the non-metallic component of the substrate or cover. Deposition may be done by sputtering, evaporation or by laminating thin layers of metals onto a relatively thicker glass layer with thermally conductive adhesives. Alternatively, glass may be deposited onto a pre-existing metal layer as long as the non-metallic glass layer serves as the primary component of the composite. An OLED display may be completed before the metal layer is applied to the non-metallic layer of either the cover or the substrate (for a bottom- or top-emitting OLED display respectively). This process maximizes the use of existing OLED display manufacturing equipment.

Depending on the size of the substrate or cover, the thickness of the metal layer, the coefficient of thermal expansion (CTE) of the metal, and the characteristics of the non-metallic layer, problems with a mis-match in heat-related expansion between the two materials may be encountered. Because the metal is not used as a conductor or primarily for rigidity of the substrate, the metal component of the composite substrate may be deposited or attached in separate, smaller pieces (i.e. non-contiguous) so that, over the extent of the smaller pieces, any differences in the CTE of the two components are negligible. The pieces may, or may not be contiguous. Metal pieces that are not physically touching may reduce the distribution of the heat to a smaller extent. Moreover, where the components of the substrate are laminated with an adhesive, suitable adhesives may be employed to control the relative expansion of the components.

According to the present invention, the substrate or cover may be either rigid or flexible. Suitably thin layers of either metals or glasses may be used. In particular, flexible plastics may be employed. Since flexible plastic materials do not effectively seal an OLED display from environmental gases or liquids, the metal layer may provide additional protection to the OLED display from the environment.

Heat additionally may be removed from the OLED display of the present invention by using conventional heat-sinks in thermal contact with the metal layer, for example at the edge of the display. When used within an appliance, the appliance may be placed in thermal contact with the metal layer to provide an external heat sink.

The metal layer 20, 20', 20" of the composite cover 11 or substrate 10 may also be employed to reduce electromagnetic radiation from or into the OLED display. By supplying a ground connection to the metal layer, electromagnetic interference from the display or from electrical components near the display may be reduced.

The invention has been described in detail with particular reference to certain preferred embodiments thereof, but it will be understood that variations and modifications can be effected within the spirit and scope of the invention. Accordingly, the preferred embodiments of the invention as described in reference to FIGS. 1, 4, and 7 are intended to be illustrative, not limiting.

PARTS LIST 10 composite substrate
11 composite cover
12 non-metallic cover layer
14 OLED light emitting element
20 metal layer
20' metal layer
20" metal layer
22 non-metallic substrate layer
30 first electrode
32 OLED light emitting layer
34 second electrode
40 light emitting area
50 energy application point
52 temperature band
66 gap

What is claimed is:

1. An OLED display comprising:
    a) a substrate;
    b) one or more OLED light emitting elements including a first electrode formed on the substrate, one or more OLED light emissive layers located over the first electrode, and a second electrode located over the OLED light emissive layers; and
    c) an encapsulating cover located over the second electrode and affixed to the substrate;
    wherein the substrate or cover comprises a composite of a glass layer and a metal layer, where the metal layer has a thickness between 1 micron and 1,000 microns and is thinner than the glass layer.

2. The OLED display claimed in claim 1 wherein the metal layer has a thickness between 5 micron and 500 microns.

3. The OLED display claimed in claim 1 wherein the metal layer comprises aluminum, silver, copper, iron, chromium, or magnesium, or an alloy including at least one of aluminum, silver, copper, iron, chromium, and magnesium.

4. The OLED display claimed in claim 1 wherein a heat sink is affixed to the edge of the cover or substrate and in thermal contact with the metal layer.

5. The OLED display claimed in claim 1 wherein the OLED display is incorporated within an appliance and the metal layer is in thermal contact with the appliance.

6. The OLED display claimed in claim 1 wherein the composite substrate or cover is formed by first forming a glass layer and depositing a metal layer upon the glass.

7. The OLED display claimed in claim 1 wherein the composite substrate or cover is formed by first forming a metal layer and coating glass upon the metal layer.

8. The OLED display claimed in claim 1 wherein the composite substrate or cover is formed by first forming a glass layer and a metal layer and affixing the metal layer to the glass layer with a thermally conductive adhesive.

9. The OLED display claimed in claim 1 wherein the first electrode, the OLED layer(s), and the second electrode are first formed upon a first side of a glass layer and the metal layer is subsequently formed upon the second side of the glass layer.

10. The OLED display claimed in claim 1 wherein the metal layer is non-contiguous.

11. The OLED display claimed in claim 1 wherein the metal layer is located between a glass cover layer and the second electrode.

12. The OLED display claimed in claim 1 wherein a glass cover layer is located between the metal layer and the second electrode.

13. The OLED display claimed in claim 1 wherein the glass is a borosilicate glass.

14. The OLED display claimed in claim 13 wherein the metal layer comprises aluminum.

15. The OLED display claimed in claim 1 wherein the metal layer reduces electromagnetic interference.

* * * * *